(12) United States Patent
Ferrante et al.

(10) Patent No.: US 7,138,619 B1
(45) Date of Patent: Nov. 21, 2006

(54) METHOD AND APPARATUS FOR COINCIDENT VIEWING AT A PLURALITY OF WAVELENGTHS

(75) Inventors: Ronald A. Ferrante, Cedar Rapids, IA (US); Timothy W. Rand, Cedar Rapids, IA (US); Mary B. Lapis, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 30 days.

(21) Appl. No.: 10/952,308

(22) Filed: Sep. 28, 2004

(51) Int. Cl.
*H01J 3/14* (2006.01)
*H01J 40/14* (2006.01)
*H01L 27/00* (2006.01)
*G01J 5/02* (2006.01)
*G01J 3/00* (2006.01)
*G02B 1/10* (2006.01)

(52) U.S. Cl. .................. 250/216; 250/208.1; 250/226; 250/339.05; 359/583; 356/51

(58) Field of Classification Search ............... 356/450, 356/451, 484, 51; 359/583, 581, 584; 250/208.1, 250/214 R, 226, 339.05, 216; 348/166, 64
See application file for complete search history.

(56) References Cited

U.S. PATENT DOCUMENTS

| | | | | |
|---|---|---|---|---|
| 2,403,731 A | * | 7/1946 | MacNeille | ................... 359/488 |
| 3,893,447 A | * | 7/1975 | Hochheimer et al. | ........ 600/431 |
| 4,632,553 A | * | 12/1986 | Vidrine et al. | ............... 356/451 |
| 5,116,133 A | * | 5/1992 | Sweeney | ..................... 356/519 |
| 5,910,816 A | * | 6/1999 | Fontenot et al. | ............... 348/65 |

* cited by examiner

*Primary Examiner*—Thanh X. Luu
*Assistant Examiner*—Pascal M. Bui-Pho
(74) *Attorney, Agent, or Firm*—Nathan O. Jensen; Kyle Eppele

(57) ABSTRACT

A plurality of imagers, each responsive to a different wavelength range of light radiation, share the same optical system of lenses. An optical film on a substrate is used to split the light beam emanating from the shared optical system. The first wavelength range is reflected by the film to a first imager. The second wavelength range is transmitted through the film and the substrate to a second imager.

24 Claims, 8 Drawing Sheets

METHOD AND APPARATUS FOR COINCIDENT VIEWING AT A PLURALITY OF WAVELENGTHS

BACKGROUND OF THE INVENTION

The visual appearance of an object or a scene can be influenced by several factors. One of these factors is the characteristic of the light that illuminates the scene. For example, a scene at the beach on a bright day appears different from the same scene when viewed on an overcast day, a foggy day, or on a moonlit night. A lifeguard stand at the same beach would appear different when illuminated by a flashlight on a dark night or when illuminated by a halogen spotlight on a police cruiser. In each case, the type of light source that illuminates the scene is different, and so the appearance of the scene is different. One difference in the type of light in each of these cases is the spectral content of the light. In the visual spectrum, the spectral content of light often is described by its color. Thus, the yellow light of the sun, the blue light of a halogen lamp, and other subtle differences in the spectral content of the light that illuminates the beach all lead to a distinctively different visual experience.

A more precise way of characterizing light is to describe it in terms of its wavelength. Thus, white light (theoretically, at least) contains all wavelengths in the visible spectrum. Red light occupies a longer-wavelength end of the visible spectrum. Violet light occupies a shorter-wavelength end of the visible spectrum. Even electromagnetic radiation that is not visible can be characterized in terms of its wavelength. For example, infrared light, which is invisible to the naked eye, has a wavelength longer than that of visible red light. Ultraviolet, which also is invisible to the naked eye, has a wavelength shorter than that of visible violet light.

A second factor that influences the appearance of a scene relates to how light is reflected from objects in the scene. An object that reflects no light appears to be black. Alternatively, it could be said that a black object is one that absorbs all wavelengths of light. An object that reflects red light appears to the naked eye to be red, an object that reflects green light appears to the naked eye to be green, and so on.

A third factor that can influence the appearance of a scene may take the form of optical filters that selectively transmit different wavelengths of light. For example, a person viewing the beach while wearing sunglasses experiences a different view from that of another person who views the beach through the naked eye. Some types of sunglasses operate by selectively transmitting light only in one part of the visual spectrum. That is, they tend to block light in other parts of the visual spectrum. Sometimes this filtering can cause a scene to be viewed more clearly than would be the case when viewing the scene with the naked eye. A person viewing the beach through yellow sunglasses on a foggy day may see the beach more clearly than someone viewing the same beach with the naked eye. Yellow sunglasses selectively transmit light at the red-orange-yellow end of the visible spectrum (i.e. they attenuate light received at the blue-indigo-violet end of the visible spectrum) and thus can materially aid in viewing objects through fog. This aid arises because fog tends to scatter light in the blue part of the visible spectrum. Yellow sunglasses, by not passing the scattered light, can provide a relatively clearer view of a foggy scene. At the same time, a person wearing yellow sunglasses may fail to notice a blue object, such as a blue beach umbrella in the same scene because the light that reaches the person's eyes is somewhat devoid of information at the blue end of the spectrum.

Yet another factor that influences the appearance of a scene relates to a detector that receives the light and converts the received light into an image that can be viewed with the naked eye. Infrared film is one example of such a detector. Some types of infrared film display a high-temperature object in an image as white and a low-temperature image as black. As a basic illustration, the human eye functions as a detector when viewing a scene. As such, different persons may have different ability to detect visible light in different bands (i.e. colors). For example, a colorblind individual may not be able to discriminate between red and green. This individual may have great difficulty in seeing a red bird sitting on a branch of a green tree.

These simple examples illustrate that the appearance of a scene or an object depends upon several factors. One of these factors is the spectral content of the light source that illuminates a scene. A second factor is the manner in which objects reflect light that illuminates them. A third factor is the effect of any filters that selectively transmit light received from a scene according to the wavelength of the light. Yet a fourth factor relates to the characteristics of a detector that receives the light.

These observations about the interaction of light with objects lead to many practical applications that are important from an economic point of view. One example occurs in systems that help a pilot to visualize a runway. For example, if mobile machinery blocks a runway at night, such machinery may be invisible to the naked eye. Because there may not be enough illumination arriving at the surface of the machinery, the machinery would be invisible to the naked eye and probably would not appear in an image generated by a standard camera whose detector (e.g. conventional photographic film) is sensitive to visible wavelengths of light. However, recognizing that the heat generated by an engine radiates very strongly in the range of infrared wavelengths, a camera loaded with infrared film is likely to see the machinery very clearly. Likewise, a television camera with a detector that was sensitive to radiation in the infrared range could produce a signal that could be displayed on a monitor. A pilot then may view the detected image on a monitor in order more safely land an airplane. In another example that relates to the hazy day at the beach, haze can obscure daytime images of a runway by scattering the shorter wavelengths at the blue end of the visible spectrum. Images using only yellow, red, and near-infrared wavelengths, however, can show the runway more clearly through haze.

One way to take advantage of the information available in the different wavelength ranges just mentioned is to employ a technique called multi-spectral imaging. Multi-spectral imaging can be used to view a scene from more than one perspective, where each perspective is that of the image viewed in a different radiation band. Hence, one perspective may be the scene as viewed in the visible radiation band (e.g., the scene may be viewed in the visual and the near infrared spectral bands). Another perspective may be the same image viewed in a different spectral band (e.g., in the long infrared band). In order to view a scene from these different perspectives simultaneously, light from the scene must be directed to different detectors, each sensitive to a particular range of wavelengths. A range of wavelengths is sometimes referred to as a spectral band or, if the context is clear, simply a band.

Multiple images of the same scene using two or more wavelength ranges may be combined to reveal more information than any one image could provide. Such multi-spectral imaging may be effectively applied to military target acquisition and detection, aircraft runway visibility enhancement, aircraft runway obstacle detection, and the like.

The use of multi-spectral imaging is not restricted to military or avionics use. For example, medical applications include imaging systems for surgical support. Also, multi-spectral imaging is used in maritime applications and in earth-observing satellite systems. Such multi-spectral imaging is also used in astronomy where, for example, multi-spectral imaging systems are used to probe the far reaches of space.

Because separate perspectives of a single scene are typically combined into a composite image, good spatial registration amongst the different perspectives is also required. Good spatial registration occurs when the features of every object in the scene appear in the same location in each of the images from multiple different imagers. When two or more images of different wavelength ranges are superimposed, exact spatial registration means that details observable in different wavelength ranges will be shown with the correct spatial relationship to one another within the scene.

Light in substantially different wavelength ranges requires a different kind of light sensor or detector for each wavelength range. A typical silicon-based charge-coupled device (CCD) detector, like those used in a common video camera, for example, is sensitive to wavelengths of light that range from about 0.4 to about 1.0 microns. This range of wavelengths (i.e. this band) includes visible light (VIS) with wavelengths from about 0.4 to 0.7 microns and near infrared (NIR) with wavelengths from about 0.7 to 1.0 microns. The most useful infrared wavelength ranges are included in three bands that are not significantly absorbed by air. One of these bands is the short infrared (SIR) band with wavelengths from about 1 to 3 microns. Another of these useful bands includes the mid wave infrared (MWIR) band with wavelengths from about 3 to 5 microns. Yet another useful infrared band is the long wave infrared (LWIR) band with wavelengths from about 8 to 14 microns. Each of these bands requires a detector that is different from a typical silicon CCD detector. The detectors further are different from each other.

One problem with known multi-spectral imaging systems is that the optics involved in capturing an image from a scene may not be capable of processing radiation in more than one range of wavelength. Hence, traditional multi-spectral imaging systems use separate optical paths to process images for different detectors. By using separate optical paths to process an image at different wavelength, there is an inherent misregistration error. This misregistration error is an artifact of the fact that the scene processed by two distinct optical paths can never be exactly the same.

Several approaches are available for reducing the effect of misregistration error. One choice is to accept different views of the scene on the two detectors and to superimpose the images without any attempt to mitigate the error. This choice results in a distorted image that may obscure important details. Another choice is to augment the multi-spectral imaging system 5 by adding mechanisms to estimate the distance to a scene and to adjust the direction in which each optical path is pointed according to the relative angle with which each optical path views the scene. This choice has the effect of increasing the cost, size, and weight of a multi-spectral imaging system. The additional mechanisms also require special maintenance in order to derive the benefit offered by the mechanisms. Yet another choice is to convert each detected image to digital form and to use a digital signal processing computer to scale each image and then digitally align multiple images with each other. This technique can also reduce the misregistration error. Unfortunately, algorithms for performing such scaling are extremely complicated and employ heuristic techniques that are not guaranteed to be appropriate in all cases. Additionally, such digitally-based systems are very expensive to develop and test.

SUMMARY OF THE INVENTION

Presently disclosed are a method and apparatus for simultaneous detection of radiation at a plurality of wavelengths. According to this method, radiation in a first wavelength is received along with radiation in a second wavelength range. Radiation in the first wavelength range is reflected while radiation in the second wavelength range is transmitted through a substrate. The spatial relationship between the reflected first wavelength range radiation and the transmitted second wavelength range radiation is maintained. An image is then detected in the reflected first wavelength radiation. An image is also detected in the second wavelength radiation that is transmitted through the substrate.

BRIEF DESCRIPTION OF THE DRAWINGS

The present invention will hereinafter be described in conjunction with the appended drawings and figures, wherein like numerals denote like elements, and in which.

DETAILED DESCRIPTION OF THE INVENTION

Figure 1:
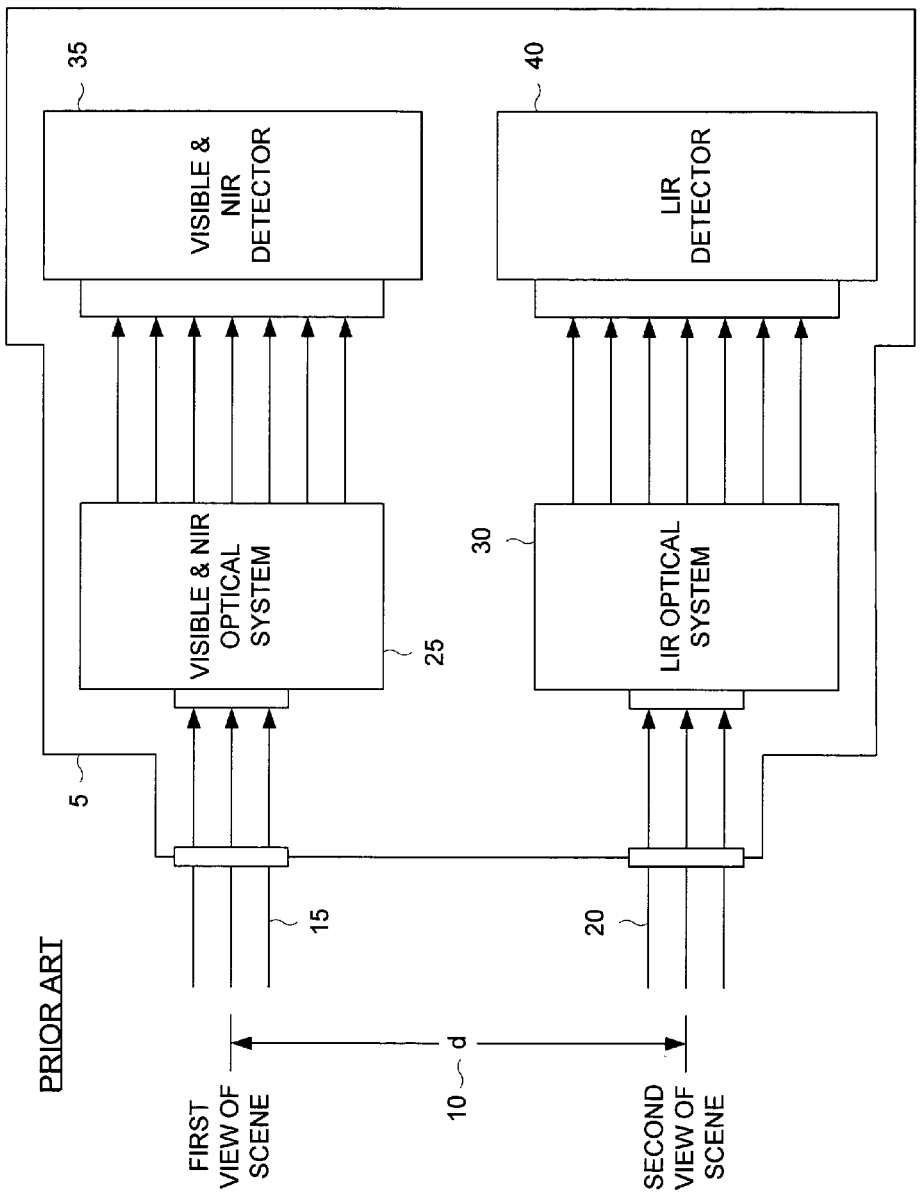
FIG. 1 is a pictorial diagram of a prior art multi-spectral imaging system.

FIG. 1 is a pictorial diagram of a prior art multi-spectral imaging system. This imaging system 5 comprises two separate optical systems that receive light from a scene. The two optical systems are oriented to receive light through parallel paths separated by a distance "d" 10. Light from a first view 15 of a scene is received by a first optical system 25 and is detected by a first detector 35 wherein the first detector 35 is sensitive to light in a first wavelength range. As one example, the first optical system 25 and detector 35 may comprise a visible and near infrared optical system that passes received light to a first detector that is sensitive to light in the visible and near infrared range. Light from a second view 20 of the scene is received by a second optical system 30 and is detected by a second detector 40 wherein the second detector 40 is sensitive to light in a second wavelength range. As another example, the second optical system 30 and the second detector 40 may comprise a long infrared optical system and a detector that is sensitive to light in the long infrared range, respectively.

In such a prior art multi-spectral imaging system 5, the two optical paths (15 and 20) are separated by a distance d 10 (the value of d 10 typically is a few inches). As a result of this separation, the first and second detectors (35 and 40) each generally receive a different view of the scene. As the distance to an object increases, the differences in the two perceived scenes will diminish. However, the actual scenes perceived by the first detector 35 and the second detector 40 can never be identical, irrespective of how far the objects in the scene are from the multi-spectral imaging system 5. As such, scenes detected by the first detector 35 and the second detector 40 cannot be superimposed on a display device without the aforementioned misregistration error caused by the misalignment of the images.

Figure 2:
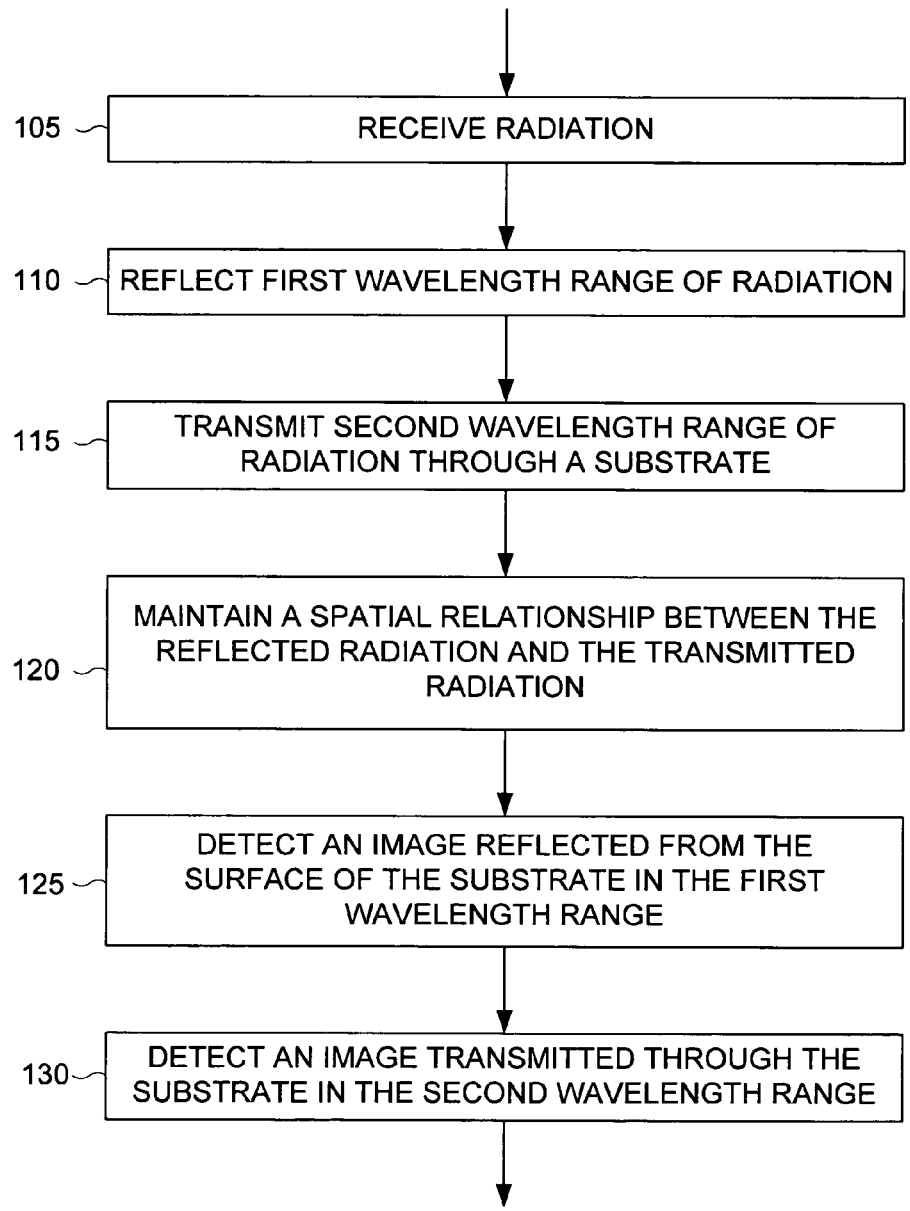
FIG. 2 is a flow diagram that depicts one example method of simultaneously detecting two bands of radiation without any misregistration error.

FIG. 2 is a flow diagram that depicts one example method of simultaneously detecting two bands of radiation without any misregistration error. According to this example method, radiation is received (step 105). Normally, the received radiation comprises a wide range of wavelengths including at least two ranges of wavelengths of interest. According to one illustrative example, a first range of wavelengths may comprise the visible (VIS) and near infrared (NIR) range. According to this variation of the present method, the first wavelength range extends from about 0.4 microns to 1.0 microns. This band is of particular interest because the response of charge couple device (CCD) detectors employed in common video cameras peaks in this range. The first wavelength range is reflected (step 110) according to the present example method. The second range of wavelengths, according to yet another variation of the present method, includes the long wave infrared (LWIR) range that extends from about 8 microns to about 14 microns. According to yet another variation of the present method, the second wavelength range includes the short infrared range of wavelengths substantially between 1 micron and 3 microns. In yet another variation of the present method, the second wavelength range includes the medium infrared range of wavelengths substantially between 3 microns and 5 microns. Radiation in a selected second wavelength range is transmitted through a substrate (step 115) according to the present example method. By reflecting the first wavelength range and transmitting the second wavelength range through a substrate, the spatial relationship between two perspectives of a scene is maintained (step 120) wherein each perspective is associated with one of the two wavelength ranges of interest. A first image is then detected in the reflected radiation (step 125) and a second image is detected in the transmitted radiation (step 130).

Figure 3:
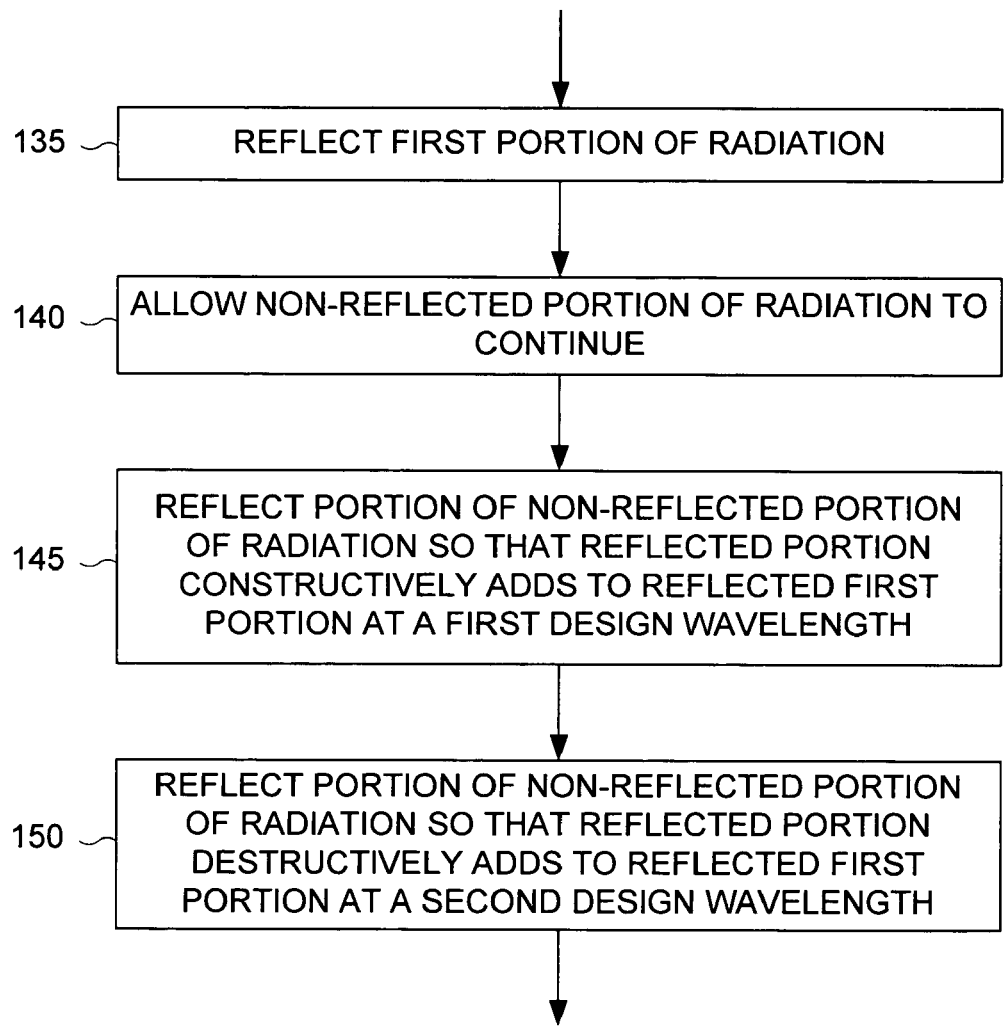
FIG. 3 is a flow diagram that describes one variation of the present method for reflecting a first wavelength range of received radiation.

FIG. 3 is a flow diagram that describes one variation of the present method for reflecting a first wavelength range of received radiation. According to this variation of the present method, a first portion of radiation is reflected (step 135) while a non-reflected portion is allowed to continue (step 140). A portion of the non-reflected radiation is reflected so as to constructively add to the first portion of reflected radiation at a first design wavelength (step 145). A portion of the non-reflected radiation is also reflected so as to destructively add to the first portion of reflected radiation at a second design wavelength (step 150).

Figure 4:
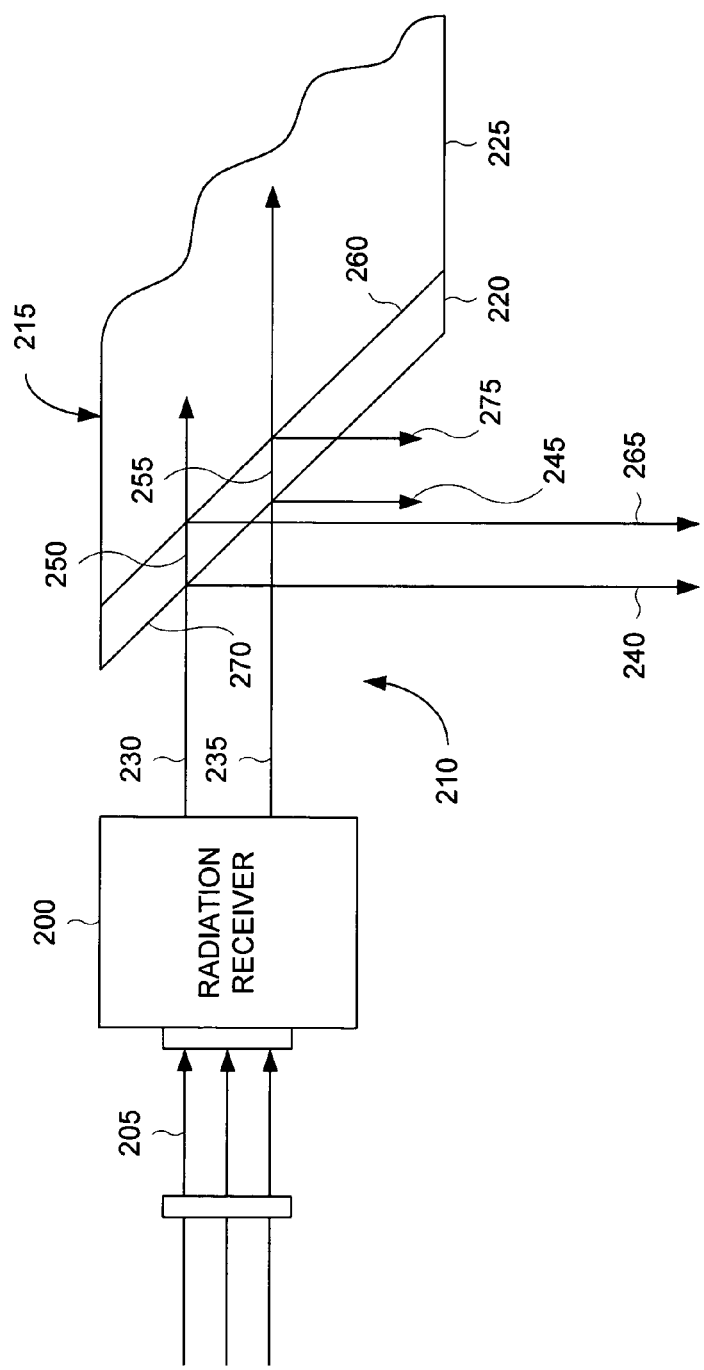
FIG. 4 is a pictorial diagram that depicts one example technique for practicing a method for reflecting a first wavelength range of received radiation.

FIG. 4 is a pictorial diagram that depicts one example technique for practicing a method for reflecting a first wavelength range of received radiation. This variation of the present method can be accomplished in numerous ways. For example, the present method is practiced in one example embodiment where a substrate 225 is disposed at a reflection angle relative to a first optical path 205. According to this example embodiment, a reflective coating 220 is disposed on a first surface 260 of the substrate 225 wherein the first surface is situated proximate to a source of radiation. As radiation at a first design wavelength 230 arrives at a first surface 270 of the reflective coating 220, a portion of the radiation is reflected 240. A remaining portion of the radiation 250 is transmitted through the reflective coating 220. When this remaining portion of radiation at the first design wavelength arrives at the first surface of the substrate 260 (which constitutes an interface between the materials comprising the reflective coating 220 and the substrate 225), a portion of this radiation is then reflected 265. Reflection is accomplished in a manner such that the portion 250 of the radiation at the first design wavelength 230 reflected at the interface of the reflective coating 220 and the substrate 225 is constructive with the radiation reflected 240 by the first surface of the reflective coating 220.

When radiation at a second design wavelength 235 arrives at the first surface of the reflective coating 220, a portion of this radiation is also reflected 245. A remaining portion 255 of the second design wavelength radiation continues through the reflective coating 220. When this remaining portion of the second design wavelength radiation arrives at the first surface 260 of the substrate, a portion 275 of this second design wavelength radiation is reflected at the interface of the reflective coating 220 and the substrate 225 such that the reflected portion 275 of the second design wavelength radiation 235 is destructive with the radiation reflected 245 by the first surface of the reflective coating 220.

Figure 5:
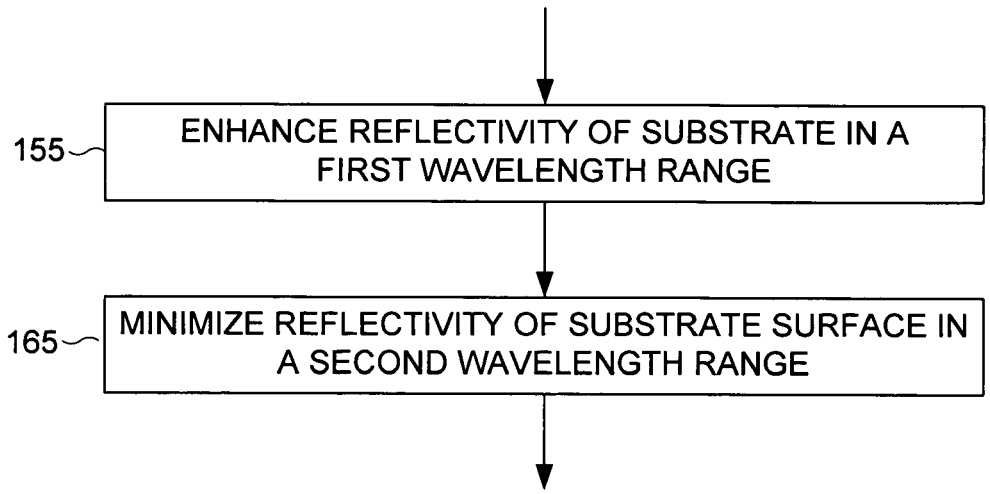
FIG. 5 is a flow diagram that depicts an alternative variation of a method for reflecting a first wavelength range.

FIG. 5 is a flow diagram that depicts an alternative variation of a method for reflecting a first wavelength range. According to this alternative variation of the present method, the reflectivity of a substrate surface is enhanced in a first wavelength range (step 155) while the reflectivity in a second wavelength range is minimized (step 165). As such, additional variations of the present method provide for enhancing the reflectivity of the surface of the substrate within a range of wavelength including wavelengths substantially between 0.4 microns and 1 micron. This range of wavelengths is commensurate with the visible range and the near infrared range, both of which are typically detected using a CCD imaging device. It should be appreciated that any suitable detection method can be used and the scope of the claims appended hereto are not intended to be limited to any particular examples presented herein.

Concurrently with enhancing the reflectivity of one wavelength range, one variation of the present method provides for minimizing the reflectivity in a range that includes wavelengths substantially between 1 micron and 3 microns. This range is typically associated with short infrared radiation. In yet another variation of the present method, reflection of wavelengths substantially between 3 microns and 5 microns are minimized while reflectivity in a first wavelength range is enhanced. This range of radiation is typically referred to as the medium infrared range. According to yet another alternative method, reflection of long infrared radiation substantially between 8 microns and 14 microns is minimized while reflectivity in a first wavelength range is enhanced.

Figure 6:
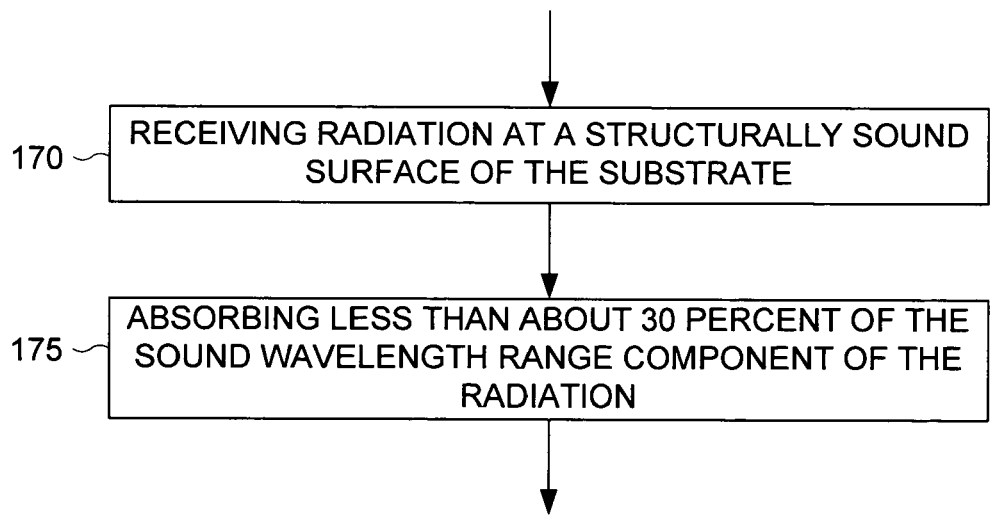
FIG. 6 is a flow diagram that depicts one alternative example method for transmitting a second wavelength range of radiation.

FIG. 6 is a flow diagram that depicts one alternative example method for transmitting a second wavelength range of radiation. According to this alternative example method, radiation is received at a structurally sound surface (step 170). The required mechanical stability is such that the beam splitter produces an angular image displacement of less than arctangent (P/F), where P is the imaging sensor pixel dimension and F is the effective focal length on the imaging lens used. One feature of the present method is that of transmitting radiation through a material with high refractive index homogeneity, on the order of less than 0.001 index inhomogeneity. Accordingly, a stable entry surface enhances this feature of the present method. Another feature of the present method is that of transmitting radiation in a second wavelength range at a minimum absorption level. For example, according to one variation of the present method, absorption of less than approximately 30% is featured. It should be noted that the level of absorption at a second wavelength range can be adjusted to meet system requirements and any absorption level indicated herein is not intended to limit the scope of the claims appended hereto. Germanium and Silicon are examples of substrate materials that exhibit both features of structural stability and low absorption.

Figure 7:
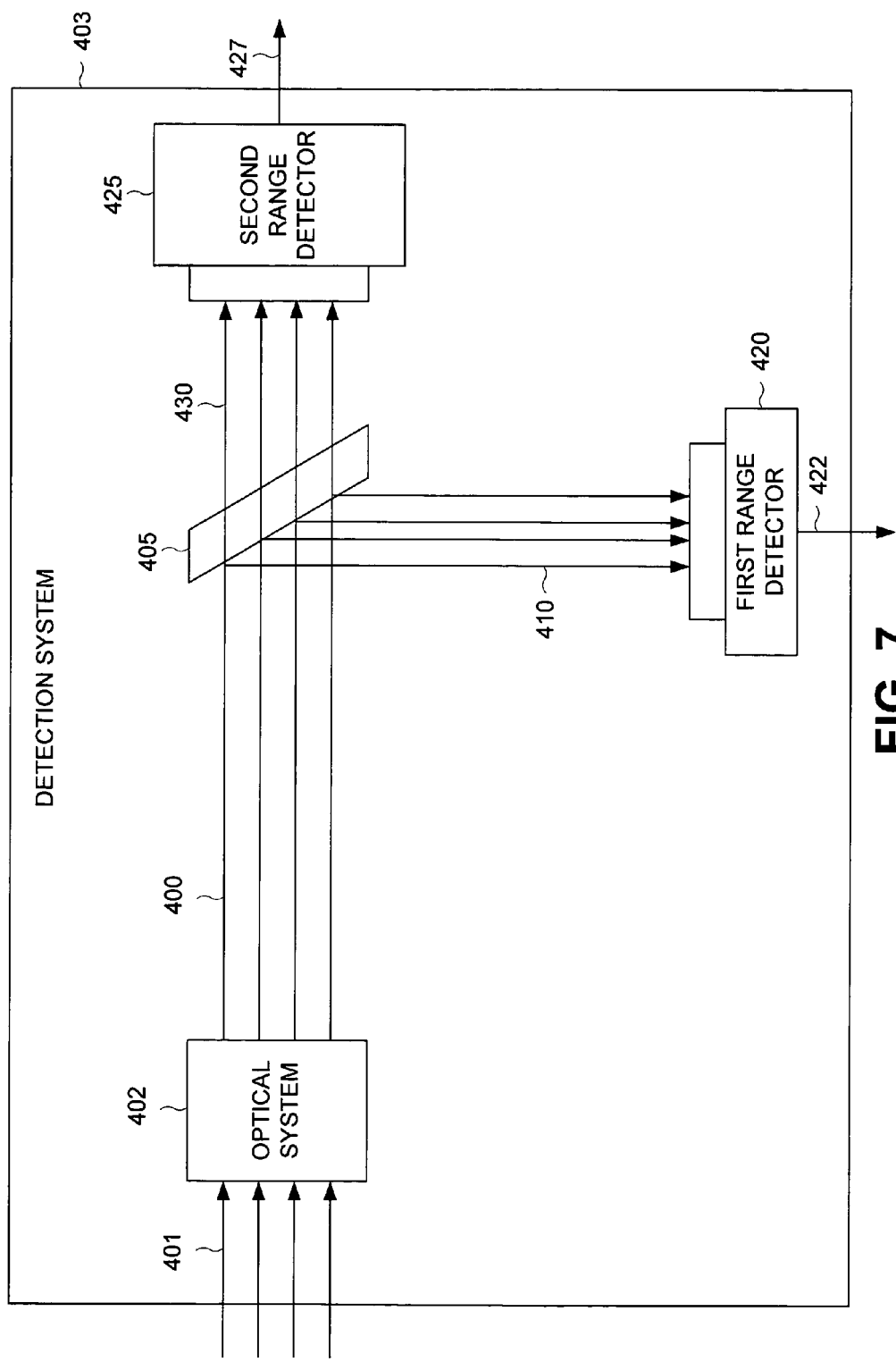
FIG. 7 is a block diagram that depicts one example embodiment of a system for simultaneous detection of radiation at a plurality of wavelength ranges.

FIG. 7 is a block diagram that depicts one example embodiment of a system for simultaneous detection of radiation at a plurality of wavelength ranges. According to this example embodiment, a system for simultaneous detection of radiation at a plurality of wavelength ranges 403 comprises an optical system 402, a beam-splitter 405, a first range detector 420 and a second range detector 425. In operation, the optical system 402 of this example embodiment receives radiation 401 from a field of view. The optical system 402 is structured to receive radiation in a plurality of wavelength ranges, for example a first wavelength range and a second wavelength range. Nothing in this example embodiment precludes the optical system 402 from processing radiation in additional wavelength ranges. The beam-splitter 405 of this example embodiment operates to reflect radiation in a first wavelength range while concurrently transmitting radiation in a second wavelength range. For example, radiation 400 emanating from the optical system 402 arrives at the beam-splitter 405. Radiation in a first wavelength range is reflected 410 while radiation in a second wavelength range is transmitted 430. The first wavelength range detector 420 is disposed to receive the reflected radiation 410 in the first wavelength range. The second wavelength range detector 425 is disposed to receive the transmitted radiation 430 in the second wavelength range. The first range detector 420 detects an image in the reflected radiation 410 and generates a first image signal 422 according to the image detected into the reflected radiation 410. The second range detector 425 detects an image in the transmitted radiation 430 and generates a second image signal 427 according to the image detected in the transmitted radiation 430.

According to one alternative embodiment, the beam-splitter 405 reflects radiation in a range substantially between 0.4 micron and 1 micron. In this case, the first range detector 420 comprises a visible image detector, e.g. a CCD device. As previously noted, such visible image detectors are typically sensitive to radiation in both the visible range (approximately 0.4 micron to 0.7 micron) and the near infrared range (approximately 0.7 micron and 1 micron). In yet another alternative embodiment, the beam-splitter 405 transmits radiation substantially between 1 micron and 3 microns. Accordingly, the second range detector 425 of this alternative embodiment comprises a short infrared range detector. According to yet another alternative embodiment, the beam-splitter 405 transmits radiation of wavelengths substantially between 3 microns and 5 microns. As such, the second range detector 425 of this alternative embodiment comprises a medium infrared detector. According to yet another alternative embodiment, the beam-splitter 405 transmits radiation of wavelengths substantially between 8 microns and 14 microns. As such, the second range detector 425 of this alternative embodiment comprises a long infrared detector.

Figure 8:
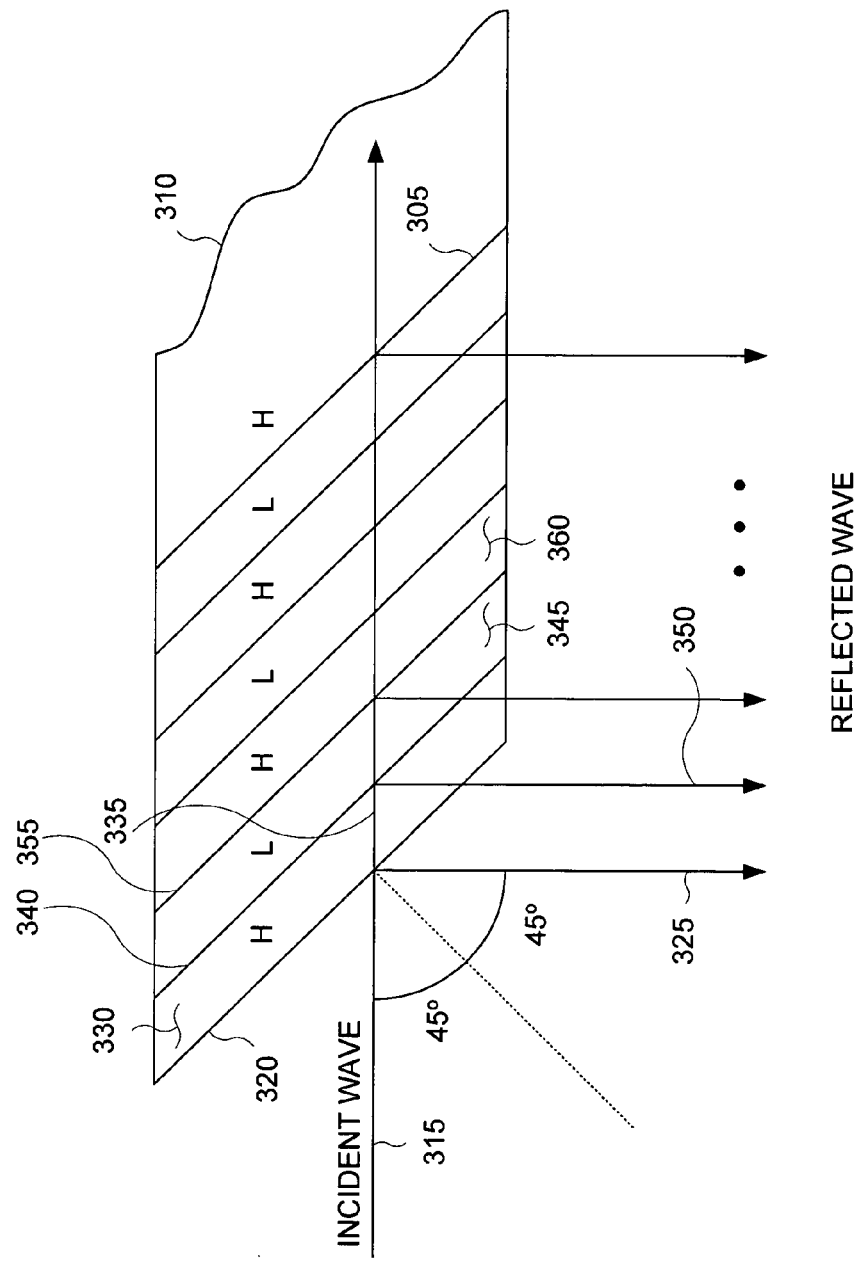
FIG. 8 is a pictorial diagram that illustrates one example alternative embodiment of a beam splitter that reflects radiation in one wavelength range while transmitting radiation in a second wavelength range.

FIG. 8 is a pictorial diagram that illustrates one example alternative embodiment of a beam splitter that reflects radiation in one wavelength range while transmitting radiation in a second wavelength range. According to this example alternative embodiment, a beam splitter comprises a plurality of reflective coatings arranged in an alternating pattern of high and low indices of refraction. For example, a substrate 310 having a relatively high index of refraction will have deposited there on a reflective coating with a relatively low index of refraction. Deposited upon the low index of refraction coating, according to yet another alternative embodiment, is a high index of refraction coating. It should be appreciated that numerous coating layers can be deposited upon the substrate 310.

To illustrate the present embodiment, the figure depicts a substrate 310 having a relatively high index of refraction. Six coating layers are then deposited upon the substrate in alternating high and low indices of refraction. It should be appreciated that any number of coating layers can be used and any number of coatings depicted in the figure are intended for illustrative purposes only and are not intended to limit the scope of the claims appended hereto. It should be further noted that an even number of coating layers can be utilized as successfully as an odd number of coating layers. Again, the claims appended hereto are not intended to be limited to either of an even number of coating layers or an odd number of coating layers.

What is important to note is that has an incident wave of radiation 315 strikes a first surface of an outermost coating layers 330, a portion of the incident wave 315 is reflected 325. When the incident wave of radiation is at a first design wavelength, the remaining portion 335 is transmitted through the outermost coating layer 330 until it strikes the interface 340 between the outermost coating layer and coating layer immediately neighboring the outermost coating layer. A portion of the transmitted radiation 335 is reflected 350 by this interface 340. When the incident wave of radiation 315 is at a first design wavelength, the reflected portion 350 of that portion of the incident wave 335 that is transmitted through the outermost reflective coating layer 330 is reflected in a constructive manner relative to the portion of radiation 325 reflected buying the first surface 320 of the outermost layer 330. The remaining radiation that is not reflected by this interface 340 is allowed to propagate through the second layer 345 relative to the outermost layer 330. At every subsequent interface between a high index of refraction material and a low index of refraction material, additional constructive reflection occurs. When radiation at a second design wavelength enters the beam splitter, the alternating pattern of reflective coatings is structured to minimize reflectance in each of the interfaces between a high index of refraction material and a low index of refraction material.

Figure 9:
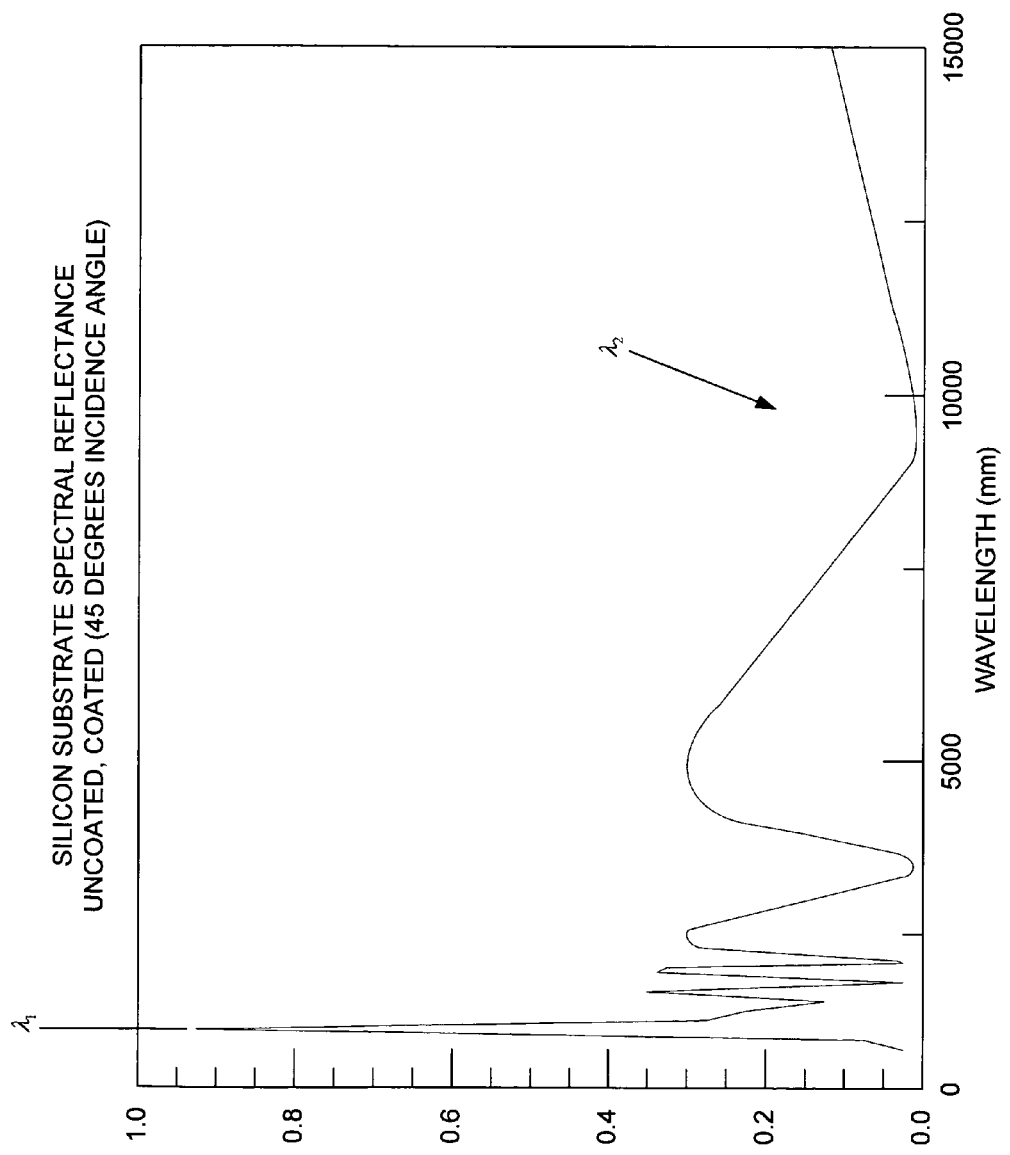
FIG. 9 is a pictorial diagram that depicts reflectance of a beam splitter at various wavelengths.

FIG. 9 is a pictorial diagram that depicts reflectance of a beam splitter at various wavelengths. A beam splitter structured according to techniques and teachings presented herein will exhibit a varying degree of reflectivity according to the wavelength of radiation incident thereon. For example, a typical beam splitter structure includes 13 number of layers deposited on a substrate according to the table below:

| Layer | Type | Index | Material | Optical Thickness @ 850 nm |
|---|---|---|---|---|
| 0 | Substrate | 3.3–4.0 | Silicon or Germanium | |
| 1 | Inner Most Coating | 1.7 | Lead Fluoride (PbF2) | .25 |
| 2 | Intermediate Coating | 2.28 | Zinc Sulphide (ZnS) | .25 |
| 3 | Intermediate Coating | 1.7 | PbF2 | .25 |
| 4 | Intermediate Coating | 2.28 | ZnS | .25 |
| 5 | Intermediate Coating | 1.7 | PbF2 | .25 |
| 6 | Intermediate Coating | 2.28 | ZnS | .25 |
| 7 | Intermediate Coating | 1.7 | PbF2 | .25 |
| 8 | Intermediate Coating | 2.28 | ZnS | .25 |
| 9 | Intermediate Coating | 1.7 | PbF2 | .25 |
| 10 | Intermediate Coating | 2.28 | ZnS | .25 |
| 11 | Intermediate Coating | 1.7 | PbF2 | .25 |
| 12 | Intermediate Coating | 2.28 | ZnS | .25 |
| 13 | Intermediate Coating | 1.7 | PbF2 | .25 |

The beam splitter structure depicted in the table above will exhibit the reflectivity as depicted in the figure wherein a peak reflectivity occurs at approximately 1 micron whereas "nulls" in reflectivity will be exhibited at approximately 3 microns and 10 microns. It should be appreciated that the example embodiment presented herein can be altered to meet specific simultaneous detection requirements and the structure of this example embodiment is not intended to limit the scope of the claims appended hereto.

While the present method and apparatus have been described in terms of several alternative methods and embodiments, it is contemplated that alternatives, modifications, permutations, and equivalents thereof will become apparent to those skilled in the art upon a reading of the specification and study of the drawings. It is therefore intended that the true spirit and scope of the claims appended hereto include all such alternatives, modifications, permutations, and equivalents.

What is claimed is:

1. A method for multi-spectral imaging comprising the steps of:

for simultaneous detection of a first wavelength range and a second wavelength range of radiation comprising:

receiving, on a multi-layered beam splitter, of the type having alternating coating layers having relatively high and low indices of refraction disposed on a substrate having a relatively high index of refraction, radiation in the first wavelength range and in the second wavelength range;

reflecting a portion of reflected radiation which comprises the first wavelength range;

transmitting radiation comprising the second wavelength range through a first layer having a relatively high index of refraction of a second layer having a relatively low index of refraction and a substrate;

reflecting a portion of a non-reflected portion of the radiation in a manner that is constructively added to the first portion of reflected radiation at a first design wavelength;

reflecting a portion of the non-reflected portion of the radiation in a manner that is destructively added to the first portion of reflected radiation at a second design wavelength;

maintaining a spatial relationship between the reflected first wavelength range of radiation and the second wavelength range of radiation transmitted through the substrate;

detecting a first image in the reflected first wavelength range of radiation;

detecting a second image in the second wavelength range of radiation transmitted through the substrate; and creating a multi-spectral image by combining the first image and the second image.

2. The method of claim 1 wherein the beam splitter comprises at least six layers of alternating indices of refraction.

3. The method of claim 2 wherein each pair of alternating coating layers are configured for successively enhancing the reflectivity of a substrate surface in a first wavelength range; and minimizing the reflectivity of the substrate surface in a second wavelength range.

4. The method of claim 3 wherein enhancing the reflectivity of a substrate surface in a first wavelength range comprises enhancing the reflectivity of a substrate surface in a visible and near infrared range substantially between 0.4 and 1 micron.

5. The method of claim 3 wherein minimizing the reflectivity of the substrate surface in a second wavelength range comprises minimizing the reflectivity of the substrate surface in a short infrared range substantially between 1 and 3 microns.

6. The method of claim 3 wherein minimizing the reflectivity of the substrate surface in a second wavelength range comprises minimizing the reflectivity of the substrate surface in a medium infrared range substantially between 3 and 5 microns.

7. The method of claim 3 wherein minimizing the reflectivity of the substrate surface in a second wavelength range comprises minimizing the reflectivity of the substrate surface in a long infrared range substantially between 8 and 14 microns.

8. The method of claim 1 wherein transmitting a second wavelength range of said radiation through a substrate comprises:

receiving said radiation at a structurally sound surface of the substrate so as to limit angular image displacement to less than arctangent (P/F), where P is an imaging sensor pixel dimension and F is an effective focal length on an imaging lens; and absorbing less than approximately 30 percent of the second wavelength range component of said radiation.

9. The method of claim 1 wherein reflecting the first wavelength range comprises reflecting a wavelength range substantially between 0.4 and 1 micron.

10. The method of claim 1 wherein transmitting the second wavelength range comprises transmitting a wavelength range substantially between 1 and 3 microns.

11. The method of claim 1 wherein transmitting the second wavelength range comprises transmitting a wavelength range substantially between 3 and 5 microns.

12. The method of claim 1 wherein transmitting the second wavelength range comprises transmitting a wavelength range substantially between 8 and 14 microns.

13. An apparatus for simultaneous viewing images of multiple spectra via detection of a first wavelength range and a second wavelength range of radiation comprising:
   optical system capable of receiving radiation in the first wavelength range and the second wavelength range;
   a multi-layer beam splitter comprising a plurality of coatings having alternating relatively high and low indices of refraction, the beam splitter being capable of reflecting the first wavelength range and transmitting the second wavelength range;
   wherein the plurality of coatings are capable of:
      reflecting a first portion of the radiation;
      allowing a non-reflected portion of the radiation to continue;
      reflecting a portion of the non-reflected portion of the radiation in a manner that is constructively added to the first portion of reflected radiation at a first design wavelength;
      reflecting a portion of the non-reflected portion of the radiation in a manner that is destructively added to the first portion of reflected radiation at a second design wavelength;
   a first detector disposed to be capable of detecting the reflected radiation in the first wavelength range; and
   a second detector disposed to be capable of detecting the transmitted radiation in the second wavelength range; and
   a means for combining images from the first detector with images from the second detector.

14. The apparatus of claim 13 wherein the beam splitter comprises:
   at least six coatings upon a substrate where the coating have alternating high and low indices of refraction.

15. The apparatus of claim 13 wherein the plurality of coatings deposited on a first surface of the substrate wherein each alternating pair of the plurality of coatings are successively capable of:
   enhancing reflectivity in first wavelength range; and
   minimizing reflectivity in a second wavelength range.

16. The apparatus of claim 15 wherein the first wavelength range comprises a visible and near infrared range substantially between 0.4 and 1 micron.

17. The apparatus of claim 15 wherein the second wavelength range comprises a visible and near infrared range substantially between 1 and 3 microns.

18. The apparatus of claim 15 wherein the second wavelength range comprises a medium infrared range substantially between 3 and 5 microns.

19. The apparatus of claim 15 wherein the second wavelength range comprises a long infrared range substantially between 8 and 14 microns.

20. The apparatus of claim 13 wherein the beam splitter comprises a substrate selected from a group consisting of silicon and germanium.

21. The apparatus of claim 13 wherein the beam splitter reflects radiation in a range substantially between 0.4 and 1 micron.

22. The apparatus of claim 13 wherein the beam splitter transmits radiation in a range substantially between 1 and 3 microns.

23. The apparatus of claim 13 wherein the beam splitter transmits radiation in a range substantially between 3 and 5 microns.

24. The apparatus of claim 13 wherein the beam splitter transmits radiation in a range substantially between 8 and 14 microns.

* * * * *